United States Patent [19]

Haskell

[11] Patent Number: 4,481,705
[45] Date of Patent: Nov. 13, 1984

[54] PROCESS FOR DOPING FIELD ISOLATION REGIONS IN CMOS INTEGRATED CIRCUITS

[75] Inventor: Jacob D. Haskell, Palo Alto, Calif.

[73] Assignee: Advanced Micro Devices, Inc., Sunnyvale, Calif.

[21] Appl. No.: 504,193

[22] Filed: Jun. 14, 1983

[51] Int. Cl.³ .......................................... H01L 21/76
[52] U.S. Cl. ..................................... 29/571; 29/578; 148/1.5; 357/42
[58] Field of Search ....................... 357/23 CS, 42, 50; 29/571, 576 B, 578; 148/1.5

[56] References Cited

U.S. PATENT DOCUMENTS 4,013,484  3/1977  Boleky et al. ............. 357/23 CS X
4,244,752  1/1981  Henderson, Sr. et al. ....... 357/42 X
4,391,650  7/1983  Pfeifer et al. ..................... 357/42 X
4,420,872 12/1983  Solo De Zaldivar ............ 357/42 X Primary Examiner—Brian E. Hearn
Assistant Examiner—Alan E. Schiavelli
Attorney, Agent, or Firm—Patrick T. King; J. Vincent Tortolano

[57] ABSTRACT

A process for fabricating doped regions in a semiconductor substrate 10 beneath regions of oxidized silicon 21 includes the steps of fabricating a first mask 23 over the substrate 10 except where field regions 21 are desired, introducing p type impurity 30 in to the unmasked regions, oxidizing the silicon substrate 10 except where overlayed by the first mask 23 to form field regions 21, fabricating a second mask 28/23 over the semiconductor substrate 10 except for second field regions, introducing n conductivity type impurity 32 into the second field regions, and oxidizing the substrate to form second field regions 21.

17 Claims, 5 Drawing Figures

PROCESS FOR DOPING FIELD ISOLATION REGIONS IN CMOS INTEGRATED CIRCUITS

BACKGROUND OF THE INVENTION

1. Field of the Invention

This invention relates generally to processes for fabricating semiconductor devices in integrated circuits, and to processes for doping the substrate beneath the field regions in CMOS integrated circuits. Most specifically the invention relates to a process for doping the silicon beneath the field isolation regions in CMOS integrated circuits in a manner compatible with conventional n-MOS process technology.

2. Description of the Prior Art

Complementary metal-oxide-silicon devices (known as "CMOS") are integrated circuits in which both n-MOS and p-MOS transistors are formed in a single substrate. If the circuits are fabricated in a n-type substrate, then a p-channel transistor is made in a conventional manner, but an n-channel transistor requires an island of p-type material. In the fabrication of CMOS devices, the p-conductivity type wells (or n-type wells if a p substrate is used) must be electrically isolated from the surrounding substrate. In conventional CMOS processes this isolation is achieved by formation of a relatively thick layer of oxidized silicon around the periphery of the p-well and extending into the substrate. To prevent channel inversion, selected conductivity type impurity is typically introduced into the silicon substrate to form a doped region beneath the field oxide regions. In the prior art this doped region, often termed the "field implant," typically has been achieved in one of two ways. According to a first process, for example, as shown and described in U.S. Pat. No. 4,306,916 to Wollesen et al., a low energy implant is used to form a doped region beneath the field oxide. The single implant relies upon the masking properties of the composite layer of silicon dioxide and silicon nitride to shield underlying regions of the wafer where a lesser impurity concentration is desired. In an alternate embodiment, a two-step process is used to dope both the p-well and the regions beneath the field oxide.

An alternative way of fabricating field implants in such a structure is described in "Silicon-Gate N-Well CMOS Process by Full Ion-Implantation Technology," by T. Ohzone et al. published in *IEEE Transactions on Electron Devices*, Volume Ed-27, No. 9, September 1980, at page 1789. The process described relies upon a double layer of photoresist to provide appropriate impurity concentrations in both the wells and beneath the field oxide regions.

Unfortunately, both of the above processes are difficult to control, and are not compatible with standard n-MOS process lines. Compatibility with standard n-MOS process lines is highly advantageous in commercial semiconductor operations because such compatibility eliminates the need to establish separate processing facilities for the initial fabrication steps in the manufacture of CMOS devices. Of course, difficulty in controlling the processes of the prior art results in lower yields and lesser quality products than that achievable with processes which are more readily controlled.

SUMMARY OF THE INVENTION

The process of this invention provides unique advantages over the processes of the prior art described above. First, the invention overcomes the difficulty of controlling the depth of a shallow field ion implantation step, or a complicated double photoresist process as described in the prior art. In addition, the invention is compatible with standard n-MOS processing, thereby enabling devices using the invention to be manufactured on the same production lines as n-MOS devices. The invention provides self-aligned n-field and p-field implants, and allows the opportunity to fabricate depletion devices with zero threshold voltage, if desired. Furthermore the invention is particularly suitable for higher voltage CMOS devices such as EPROM's in which a field implant to prevent inversion is necessary to maintain relatively thinner field oxide regions.

In a preferred embodiment in a process for fabicating complementary transistors in a semiconductor substrate having a first conductivity type well region in an opposite conductivity type substrate thereby forming a pn junction, the improvement comprises introducing the field impurities by the process of fabricating a first mask over the semiconductor substrate except for a first field region straddling the junction of the first conductivity type well-region and the substrate; introducing first conductivity type impurities into the first region; forming insulating material over the first field region; fabricating a second mask over the semiconductor substrate except for a second field region, the second field region being disposed at least partially contiguous to the first field region; introducing opposite conductivity type impurity into the second field region; and forming insulating material over the second field region.

DETAILED DESCRIPTION OF THE PREFERRED EMBODIMENTS

Figure 1:
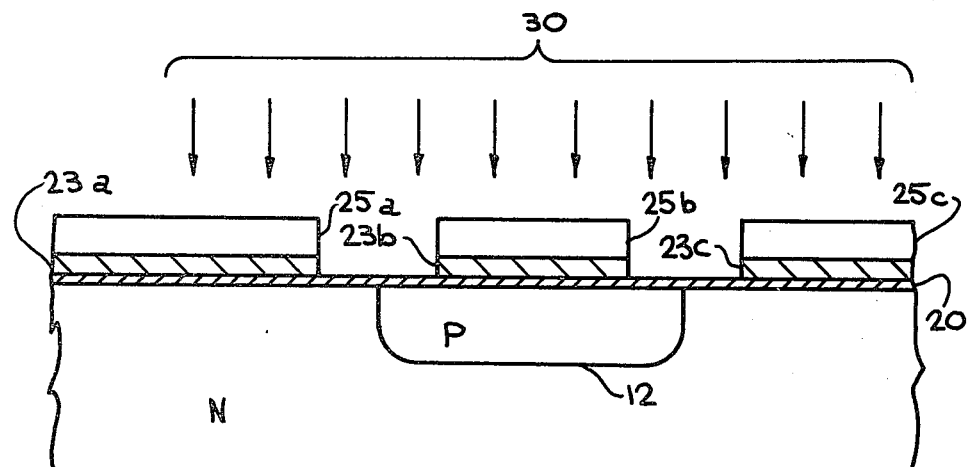
FIG. 1 is a cross section of a semiconductor structure which may be manufactured using known process techniques.

FIG. 1 is a cross sectional view of a semiconductor structure which is manufactured using well-known process techniques. As shown in FIG. 1 a semiconductor structure includes an n-conductivity type substrate 10 and p-conductivity type well 12 formed therein. As is known, the structure depicted in FIG. 1 may be used for the fabrication of complementary MOS devices, with n-channel devices being manufactured in the p-type well 12. On the upper surface of substrate 10 a relatively thin layer of silicon dioxide, on the order of 500 Angstroms thick is formed, typically by heating the underlying substrate to a temperature of 1000° C. for 30 minutes in an oxygen ambient. On the upper surface of silicon dioxide 20, a layer of silicon nitride 23 about 700 Angstroms thick is formed, for example, using known chemical vapor deposition processes. On the upper surface of silicon nitride 23 a layer of photoresist 25 is deposited.

Photoresist 25 is then patterned using conventional photolithographic techniques to form regions of photoresist 25a, 25b, and 25c as shown.

After patterning of photoresist layer 25, silicon nitride layer 23 is etched, using either an anisotropic or isotropic process as desired. In the preferred embodiment silicon nitride layer 23 is etched using an anisotropic plasma process. After the completion of the etching, p-conductivity type impurity 30 is implanted into the wafer as shown schematically by the arrows above FIG. 1. The p-conductivity type impurity 30 will typically be boron. In the preferred embodiment the boron is implanted with an energy of 120 kev to create regions within the semiconductor structure having an impurity concentration of approximately $10^{16}$ atoms per cubic centimeter. The boron ions 30 may be implanted across the entire surface of the wafer, or may be implanted through a mask. If they are implanted across the entire surface of the wafer, the implant energy and the thicknesses of nitride 23 and photoresist 25 will be selected to prevent the boron ions from reaching the surface of the wafer other than where openings in the nitride layer 23 have been formed. The purpose of the boron implantation is to prevent channel inversion beneath field oxide regions which will be formed subsequently.

Figure 2:
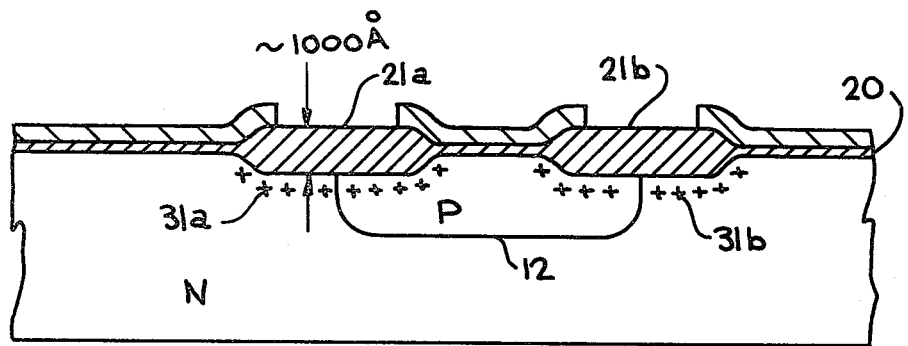
FIG. 2 is a cross sectional view of the structure after implantation of p-type impurity and formation of a portion of the field oxide regions.

Next, as shown in FIG. 2, the remaining photoresist regions 25 are removed from the upper surface of the wafer, and the wafer is heated in oxygen ambient to form the field oxide regions 21a and 21b as shown. In the preferred embodiment silicon dioxide 21 is approximately 1000 Angstroms thick and is fabricated by heating the wafer to a temperature of 1000° C. for 150 minutes. During the oxidation process the boron ions present in the substrate 10 and well 12 will be driven further into the wafer to form doped regions 31a and 31b directly beneath field oxide regions 21a and 21b, respectively.

Figure 3:
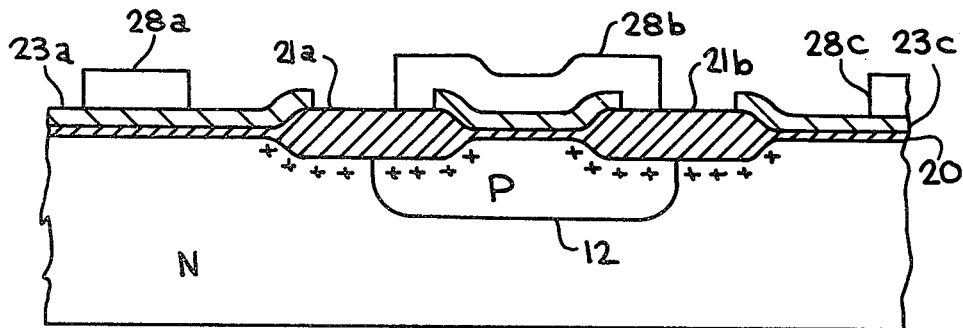
FIG. 3 is a subsequent cross sectional view after formation of regions of photoresist on the upper surface of the structure to define regions in the underlying material.

As next shown in FIG. 3, a layer of photoresist 28 is deposited across the upper surface of the wafer, and patterned using known photolithographic techniques. The pattern of photoresist 28 will define the regions of the wafer which receive impurity of opposite conductivity type to that already implanted. In particular, and as shown in FIG. 3, openings are made in photoresist layer 28 over all regions where n conductivity type impurity are desired, while regions of photoresist 28 remain on the surface of the wafer over the p type well 12, and over a region of substrate beneath layer 28a in which p channel transistors will be formed. Photoresist 28 is used to mask etching of the silicon nitride 23. Nitride 23 is etched using a conventional plasma process to create the structure shown in FIG. 4.

Figure 4:
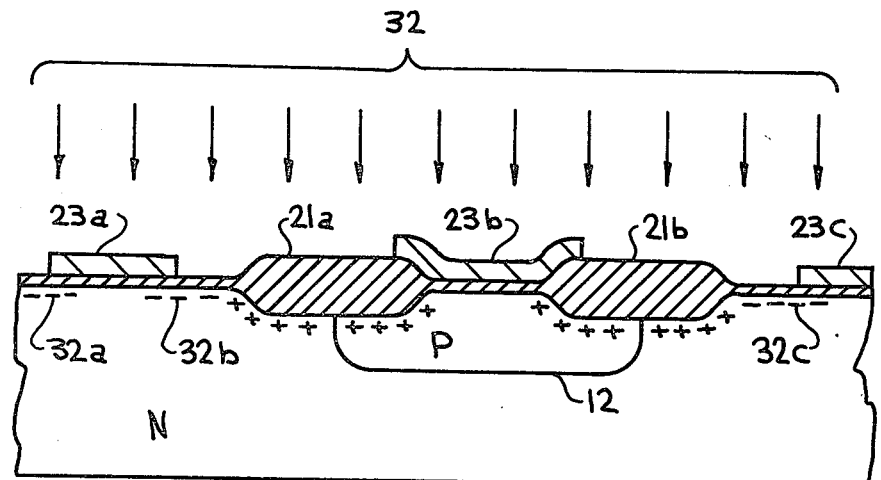
FIG. 4 is a subsequent cross sectional view after use of the photoresist to pattern underlying materials.

As shown in FIG. 4 nitride regions 23a, 23b and 23c will protect the underlying wafer from subsequent process operations. In particular, nitride region 23a serves to protect a region of the n conductivity type substrate in which p channel transistors will be fabricated. Nitride 23b protects the p well 12, and nitride 23c protects another region of the substrate in which p channel transistors will be fabricated.

As shown schematically in FIG. 4, a sheet implantation of n conductivity type material 32 is performed next. This process forms n conductivity type regions 32a, 32b and 32c in substrate 10 at the locations shown. The implant of n type material 32 is prevented from reaching undesired portions of the substrate by the nitride 23 and silicon dioxide 21. In the preferred embodiment the n conductivity type material comprises arsenic, and is introduced with an implant energy of 120 kev to form regions having an impurity concentration of $10^{15}$ atoms per cubic centimeter.

Figure 5:
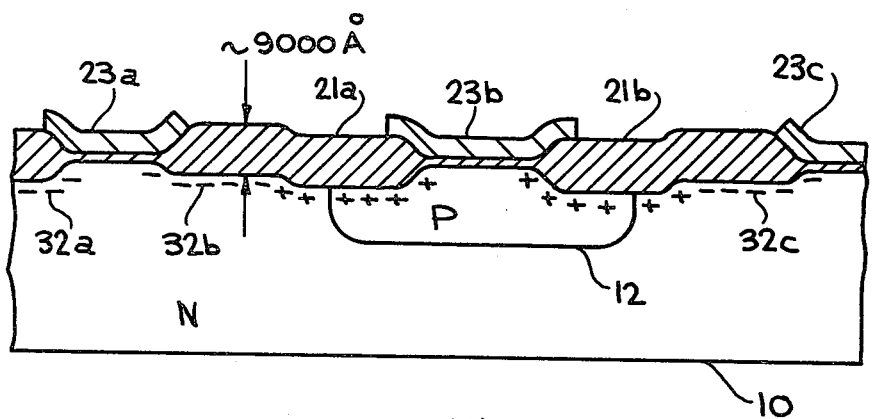
FIG. 5 is a subsequent cross sectional view after implantation of n-type impurity and formation of additional regions of field oxide.

As next shown in FIG. 5 the wafer is raised to a temperature of 950° C. and held for 10 hours in steam to form the field oxide regions 21a and 21b over the arsenic implant regions 32a, 32b and 32c. The structure depicted in FIG. 5 is now suitable for conventional subsequent processing in which active and/or passive devices may be fabricated in the substrate 10.

Of particular advantage is that the process of this invention has formed the p and n conductivity type field implant regions without requiring a low energy implant or the use of a complicated double photoresist process, as required by prior art processing. Each of these prior art processes were difficult to control and were not compatible with n-MOS processes, thereby requiring separate fabrication lines for the steps shown in the figures for CMOS devices as opposed to n-MOS devices. The low energy implants of prior art processes often resulted in segregation of the impurity concentration in the field oxide because the boron concentration was depleted by the formation of the field oxide when formed using such shallow implants. The process of the invention also allows the fabrication of n-channel devices having zero threshold voltage because the n conductivity type impurity is introduced using a separate mask and ion implantation. Furthermore, the invention provides an improved technique for preventing channel inversion in higher voltage CMOS devices such as EPROM's in which a field implant is desirable to maintain relatively thinner field oxide regions.

Although the invention has been explained in conjunction with the foregoing specific process description, including preferred thicknesses, temperatures, etc., it should be understood that the foregoing description is for the purposes of explaining the invention. The scope of the invention may be ascertained from the appended claims.

I claim:

1. In a process for fabricating complementary transistors in a semiconductor substrate having a first conductivity type well region in an opposite conductivity type substrate, the improvement comprising introducing a field implant by a process comprising:

fabricating a first mask over a semiconductor substrate except for a first field region straddling the junction of the first conductivity type well-region and the substrate;

introducing first conductivity type impurity into the first field region;

forming insulating material over the first field region;

fabricating a second mask over the semiconductor substrate except for a second field region, said second mask at least partially including a portion of said insulating material formed over said first field region, so as to dispose said first field region and said second field region such that said second field region is self-aligned with, and does not overlap, said first field region and such that an edge of said first field region is adjacent to, and in contact with, an edge of said second field region;

introducing opposite conductivity type impurity into the second field region; and forming insulating material over the second field region.

2. A process as in claim 1 wherein the step of forming insulating material over the first field region comprises oxidizing the semiconductor substrate.

3. A process as in claim 2 wherein the step of forming insulating material over the second field region comprises oxidizing the semiconductor substrate.

4. A process as in claim 1 wherein the step of fabricating a first mask comprises patterning a layer of oxidation resistant material over the substrate.

5. A process as in claim 4 wherein the step of introducing first conductivity type impurity comprises implanting those impurities using ion implantation.

6. A process as in claim 5 wherein the step of fabricating a second mask comprises patterning a layer of oxidation resistant material over the substrate.

7. A process as in claim 6 wherein the step of introducing opposite conductivity type impurity comprises implanting those impurities using ion implantation.

8. A process as in claim 7 wherein each of the steps of forming insulating material comprise oxidizing the semiconductor substrate.

9. A process as in claim 1 wherein the first conductivity type well region comprises a p conductivity type well in an n conductivity type substrate.

10. A process as in claim 9 wherein the step of fabricating a first mask comprises forming a layer of silicon nitride over a central region of the p conductivity type well, which central region is not adjacent to, or in contact with any portion of the n conductivity type substrate.

11. A process as in claim 10 further comprising fabricating portions of the first mask over regions of the n conductivity type substrate not adjacent to, or in contact with the p conductivity type well.

12. A process as in claim 11 wherein the step of introducing first conductivity type impurity comprises introducing p conductivity type impurity.

13. A process as in claim 12 wherein the step of forming insulating material over the first field region comprises oxidizing the p well and the substrate not overlayed by the silicon nitride.

14. A process as in claim 13 wherein the step of fabricating a second mask comprises etching the layer of silicon nitride to expose areas of said oxide region over said second field region so as to allow said introducing of said opposite conductivity type impurity into the second field region, while protecting the central region of the p conductivity type well and protecting said regions of the n conductivity type substrate which are not adjacent to, or in contact with the p conductivity type well.

15. A process as in claim 14 wherein the step of introducing opposite conductivity type impurity comprises introducing n conductivity type impurity.

16. A process as in claim 15 wherein the step of forming insulating material over the second field region comprises oxidizing the second field region.

17. A process as in claim 16 wherein the p conductivity type comprises boron and the n conductivity type comprises arsenic.

* * * * *